(12) United States Patent
Miwa et al.

(10) Patent No.: US 9,484,321 B2
(45) Date of Patent: Nov. 1, 2016

(54) HIGH FREQUENCY DEVICE

(71) Applicant: Mitsubishi Electric Corporation, Tokyo (JP)

(72) Inventors: Shinichi Miwa, Tokyo (JP); Shohei Imai, Tokyo (JP); Masaharu Hattori, Tokyo (JP); Takaaki Yoshioka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 532 days.

(21) Appl. No.: 13/961,976

(22) Filed: Aug. 8, 2013

(65) Prior Publication Data
US 2014/0146506 A1    May 29, 2014

(30) Foreign Application Priority Data
Nov. 27, 2012  (JP) ................ 2012-258889

(51) Int. Cl.
*H01L 23/00* (2006.01)
*H01L 23/66* (2006.01)
*H05K 1/02* (2006.01)

(52) U.S. Cl.
CPC ............ *H01L 24/49* (2013.01); *H01L 23/66* (2013.01); *H01L 24/48* (2013.01); *H01L 2224/05599* (2013.01); *H01L 2224/451* (2013.01); *H01L 2224/48091* (2013.01); *H01L 2224/49* (2013.01); *H01L 2224/85399* (2013.01); *H01L 2924/00014* (2013.01); *H01L 2924/19107* (2013.01); *H01L 2924/3011* (2013.01)
(Continued)

(58) Field of Classification Search
CPC ..... H05K 1/0251; H01L 24/49; H01L 24/48; H01L 23/66; H01L 2924/00014

USPC ....... 361/760, 767–778, 794, 795, 780, 782, 361/783; 174/74 R, 258, 260, 261
See application file for complete search history.

(56) References Cited

U.S. PATENT DOCUMENTS 5,140,407 A    8/1992 Kamada
(Continued)

FOREIGN PATENT DOCUMENTS

JP    59-3557 U    1/1984
JP    3-119803 A    5/1991
(Continued)

OTHER PUBLICATIONS

Japanese Patent Office; Office Action in Japanese Patent Application No. 2012-258889 (Aug. 2, 2016).

*Primary Examiner* — Ahmad D Barnes
(74) *Attorney, Agent, or Firm* — Leydig, Voit & Mayer, Ltd.

(57) ABSTRACT

A high frequency device includes a base plate having a main surface, a dielectric on the main surface, along a first side of the base plate, a signal line on the dielectric and extending from the first side toward a central portion of the main surface, an island pattern of a metal on the dielectric, a metal frame having a contact portion contacting the main surface and a bridge portion on the signal line and the island pattern, together enclosing the central portion, a lead frame connected to an outside signal line of the signal line and which is located outside the metal frame, a semiconductor chip secured to the central portion, and a wire connecting the semiconductor chip to an inside signal line of the signal line and which is enclosed within the metal frame.

6 Claims, 10 Drawing Sheets

(56) References Cited

U.S. PATENT DOCUMENTS

| | | | |
|---|---|---|---|
| 7,486,157 B2* | 2/2009 | Takagi | H01L 23/552 333/260 |
| 2012/0032190 A1 | 2/2012 | Takagi | |
| 2012/0061133 A1* | 3/2012 | Masuda | H01L 23/057 174/261 |

FOREIGN PATENT DOCUMENTS

| | | |
|---|---|---|
| JP | 3-195049 A | 8/1991 |
| JP | 8-288701 A | 11/1996 |
| JP | 2001-144510 A | 5/2001 |
| JP | 2012-038875 A | 2/2012 |
| JP | 2012-60533 A | 3/2012 |

* cited by examiner

HIGH FREQUENCY DEVICE

BACKGROUND OF THE INVENTION

1. Field of the Invention

The present invention relates to a high frequency device for controlling a high frequency signal used, e.g., for satellite communications, ground microwave communications, or mobile communications, etc.

2. Background Art

Japanese Laid-Open Patent Publication No. H08-288701 discloses a microwave integrated circuit device provided with feed-though portions. The feed-through portions of this microwave integrated circuit device have a characteristic impedance of 50Ω.

High frequency devices with a power amplifier for use in the transmitter section of a base station are sometimes designed to have a discrete configuration including only a power amplifier FET chip, or a "partial match" configuration including only an FET chip and a pre-matching substrate, in order to reduce the number of matching circuit substrates. In such a case, it is desirable that the feed-through portions of the high frequency device have the desired impedance (e.g., 50Ω). Therefore, the feed-through portions and the dimensions of the high frequency device are designed so as to achieve impedance matching to the semiconductor chip or matching circuits used.

Once the feed-through portions and the dimensions of the high frequency device have been designed and a prototype of the high frequency device has been made, it is not easy to change the impedance of the feed-through portions. This means that if the configuration of the semiconductor chip or the matching circuits is later changed, it is difficult to achieve optimum matching conditions, resulting in degraded performance of the high frequency device.

SUMMARY OF THE INVENTION

The present invention has been made to solve the above problems. It is, therefore, an object of the present invention to provide a high frequency device whose feed-through portions are provided with impedance adjusting functions so that impedance matching can be easily achieved in the high frequency device.

The features and advantages of the present invention may be summarized as follows.

According to one aspect of the present invention, a high frequency device includes a base plate having a main surface, a dielectric formed on the main surface along one side of the base plate, a signal line formed on the dielectric and extending from the one side toward a central portion of the main surface, an island pattern of a metal formed on the dielectric adjacent the signal line and extending from the one side toward the central portion without contact with the signal line, a metal frame having a contact portion in contact with the main surface and having a bridge portion formed on an additional dielectric which is formed on a portion of the signal line and a portion of the island pattern, the contact portion and the bridge portion together enclosing the central portion, a lead frame connected to an outside signal line of the signal line, the outside signal line being a portion of the signal line located outside the metal frame, a semiconductor chip secured to the central portion, and a first wire connecting the semiconductor chip to an inside signal line of the signal line, the inside signal line being a portion of the signal line enclosed within the metal frame.

According to another aspect of the present invention, a high frequency device includes a base plate having a main surface, a dielectric including a first dielectric formed on the main surface along one side of the base plate, and a second dielectric in contact with a side of the first dielectric which faces toward a central portion of the main surface, the second dielectric having a different thickness than the first dielectric, a signal line formed to continuously extend on the first and second dielectrics, a metal frame having a contact portion in contact with the main surface and having a bridge portion formed on an additional dielectric which is formed on a portion of the signal line, the contact portion and the bridge portion together enclosing the central portion, a lead frame connected to a portion of the signal line outside the metal frame, a semiconductor chip secured to the central portion, and a wire connecting the semiconductor chip to either a portion of the signal line enclosed within the metal frame and formed on the first dielectric, or a portion of the signal line on the second dielectric.

According to another aspect of the present invention, a high frequency device includes a base plate having a main surface, a lower layer dielectric formed on the main surface along one side of the base plate, an intermediate metal formed on the lower layer dielectric, an upper layer dielectric having a different thickness than the lower layer dielectric and formed over a surface of the intermediate metal in such a manner as to leave a portion of the surface exposed to ambient atmosphere, a signal line formed on the upper layer dielectric, a metal frame having a contact portion in contact with the main surface and having a bridge portion formed on an additional dielectric which is formed on a portion of the signal line, the contact portion and the bridge portion together enclosing a central portion of the base plate, a lead frame connected to a portion of the signal line outside the metal frame, a semiconductor chip secured to the central portion, a first wire connecting the semiconductor chip to a portion of the signal line enclosed within the metal frame, and an additional wire connecting the signal line and the intermediate metal or connecting the intermediate metal and the base plate.

According to another aspect of the present invention, a high frequency device includes a base plate having a main surface, a dielectric formed on the main surface along one side of the base plate, a signal line formed on the dielectric and extending from the one side toward a central portion of the main surface, the signal line having an end which faces toward the central portion and which has thereon a comb-toothed portion formed in a comb shape, an additional metal portion disposed on the dielectric between teeth of the comb-toothed portion without contact with the signal line, and electrically connected to the base plate, a metal frame having a contact portion in contact with the main surface and having a bridge portion formed on an additional dielectric which is formed on a portion of the signal line which is located closer to the one side of the base plate than is the comb-toothed portion, the contact portion and the bridge portion together enclosing the central portion, a lead frame connected to a portion of the signal line located outside the metal frame, a semiconductor chip secured to the central portion and having a ground pad electrically connected to the base plate, and a first wire connecting the semiconductor chip to the comb-toothed portion.

Other and further objects, features and advantages of the invention will appear more fully from the following description.

DETAILED DESCRIPTION OF THE PREFERRED EMBODIMENTS

High frequency devices in accordance with embodiments of the present invention will be described with reference to the accompanying drawings. Throughout the specification the same or corresponding components are designated by the same reference symbols and may be described only once.

First Embodiment

Figure 1:
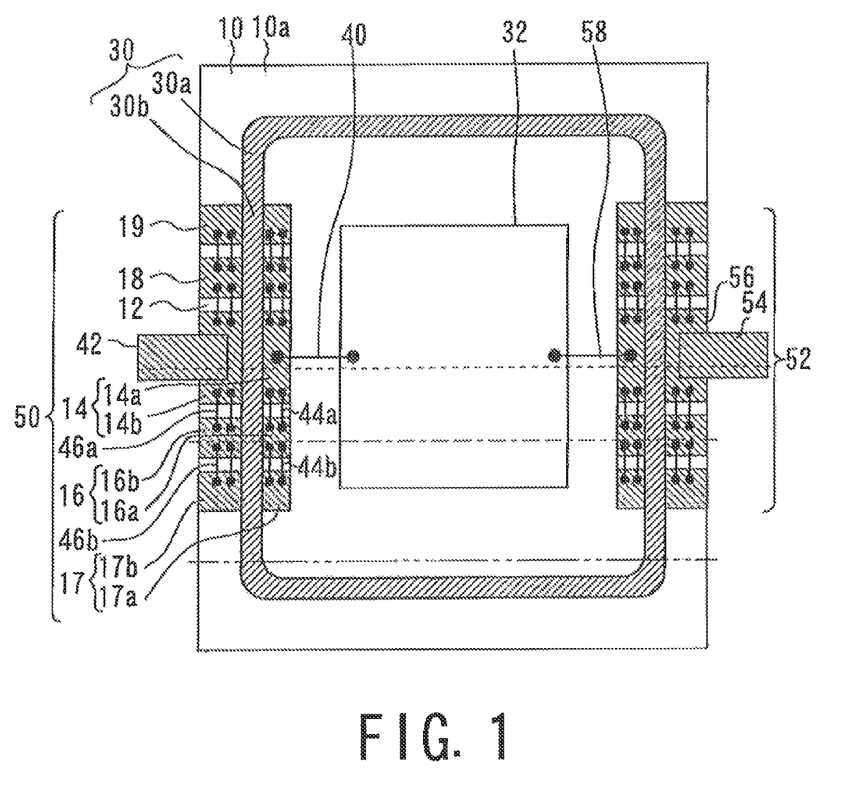
FIG. 1 is a plan view of a high frequency device in accordance with a first embodiment of the present invention.

FIG. 1 is a plan view of a high frequency device in accordance with a first embodiment of the present invention. This high frequency device includes a base plate 10 having a main surface 10a. The base plate 10 is at ground potential. A dielectric 12 is formed on the main surface 10a along one side of the base plate 10. A signal line 14 for transmitting a high frequency signal is formed on the dielectric 12. The signal line 14 is formed to extend from said one side of the base plate 10 toward the central portion of the main surface 10a.

An island pattern 16 is formed on the dielectric 12 adjacent the signal line 14. An island pattern 17 is formed adjacent the island pattern 16. The island pattern 17 is spaced from the signal line 14 further than the island pattern 16 is spaced from the signal line 14. The island patterns 16 and 17 are metal patterns extending from said one side of the base plate 10 toward the central portion of the main surface 10a without contact with the signal line 14. The island patterns 16 and 17 are formed below the signal line 14, as viewed in FIG. 1. Island patterns 18 and 19 are formed above the signal line 14, as viewed in FIG. 1.

A metal frame 30 is formed to surround the central portion of the main surface 10a. The metal frame 30 includes a contact portion 30a in contact with the main surface 10a, and a bridge portion 30b formed above the signal line 14 and the island patterns 16, 17, 18, and 19 (as viewed in FIGS. 2 and 3). The contact portion 30a and the bridge portion 30b together enclose the central portion of the main surface 10a. A semiconductor chip 32 is secured to the central portion of the main surface 10a. The semiconductor chip 32 is an FET chip for amplifying high frequency signals.

The portion of the signal line 14 enclosed within the metal frame 30 is referred to herein as the inside signal line 14a. The portion of the signal line 14 located outside the metal frame 30 is referred to herein as the outside signal line 14b. The portions of the island patterns 16 and 17 enclosed within the metal frame 30 are referred to herein as the inside island patterns 16a and 17a, respectively. The portions of the island patterns 16 and 17 located outside the metal frame 30 are referred to herein as the outside island patterns 16b and 17b, respectively. The inside island pattern 18a and the outside island pattern 18b of the island pattern 18, and the inside island pattern 19a and the outside island pattern 19b of the island pattern 19, are defined in the same manner as, e.g., the inside island pattern 16a and the outside island pattern 16b of the island pattern 16.

Figure 2:
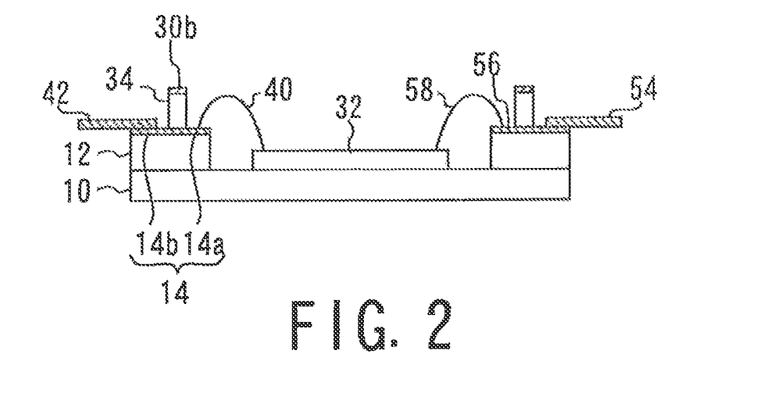
FIG. 2 is a cross-sectional view taken along the simple dashed line of FIG. 1.
Figure 3:
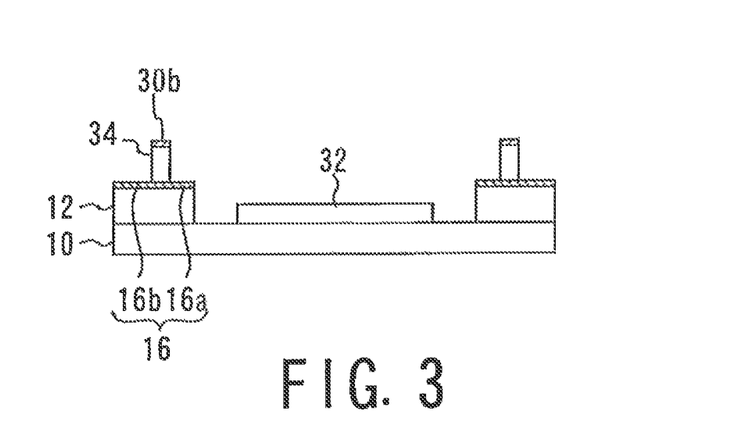
FIG. 3 is a cross-sectional view taken along the chain single-dashed line of FIG. 1.

FIG. 2 is a cross-sectional view taken along the simple dashed line of FIG. 1. An additional dielectric 34 is formed on a portion of the signal line 14. The bridge portion 30b is formed on the additional dielectric 34 located on the signal line 14. FIG. 3 is a cross-sectional view taken along the chain single-dashed line (or chain line) of FIG. 1. A portion of the additional dielectric 34 described above is formed on a portion of the island pattern 16. The bridge portion 30b is also formed on that portion of the additional dielectric 34 located on the island portion 16.

Figure 4:
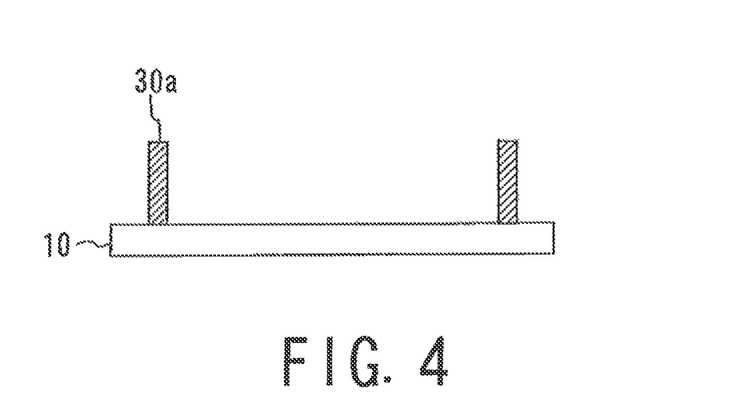
FIG. 4 is a cross-sectional view taken along the chain double-dashed line of FIG. 1.

Thus the bridge portion 30b is formed on the additional dielectric 34. Specifically, the bridge portion 30b is formed on the dielectric 34 located on portions of the signal line 14 and the island patterns 16, 17, 18, and 19. FIG. 4 is a cross-sectional view taken along the chain double-dashed line of FIG. 1. The contact portion 30a is formed on the base plate 10.

Referring back to FIG. 1, the semiconductor chip 32 and the inside signal line 14a are connected together by a first wire 40. A lead frame 42 is connected to the outside signal line 14b. The lead frame 42 is connected to an external component.

The inside signal line 14a and the inside island pattern 16a are connected together by second wires 44a. The inside island pattern 16a and the inside island pattern 17a are connected together by second wires 44b. The outside signal line 14b and the outside island pattern 16b are connected together by third wires 46a. The outside island pattern 16b and the outside island pattern 17b are connected together by third wires 46b. As can be seen from FIG. 1, the island patterns 18 and 19 are also connected together and to the signal line 14 by wires, in the same manner as the island patterns 16 and 17.

It should be noted that the signal line, island patterns, lead frame, and wires, etc. disposed on the left side of the base plate 10 together form a feed-through portion 50 (see FIG. 1). A feed-through portion 52 which has a similar configuration to the feed-through portion 50 is formed on the right side of the base plate 10. The feed-through portion 52 includes a lead frame 54 and a signal line 56. Further, the signal line 56 and the semiconductor chip 32 are connected together by a first wire 58.

The operation of the high frequency device of the first embodiment will be briefly described. A high frequency signal is received by the lead frame 54 and passed through the signal line 56 and the first wire 58 to the semiconductor chip 32. The high frequency signal is then amplified by the semiconductor chip 32 and supplied to the lead frame 42 through the first wire 40 and the signal line 14.

In the high frequency device of the first embodiment, the impedance of each feed-through portion can be adjusted by changing its effective signal line width, that is, the sum of the widths of the signal line and the island patterns connected in parallel to the signal line in the feed-through portion. Specifically, the effective signal line width of the feed-through portion is adjusted by selectively connecting and disconnecting wires between the signal line and the island patterns. In FIG. 1, the high frequency device is configured in such a manner that: in the feed-through portion 50, all of the island patterns 16, 17, 18, and 19 formed therein are connected in parallel to the signal line 14 by wires to maximize the effective signal line width of the feed-through portion 50, that is, the sum of the widths of the signal line 14 and the island patterns connected in parallel thereto; and in the feed-through portion 52, all of the island patterns 16, 17, 18, and 19 formed therein are connected in parallel to the signal line 56 by wires to maximize the effective signal line width of the feed-through portion 52, that is, the sum of the widths of the signal line 56 and the island patterns connected in parallel thereto.

Figure 5:
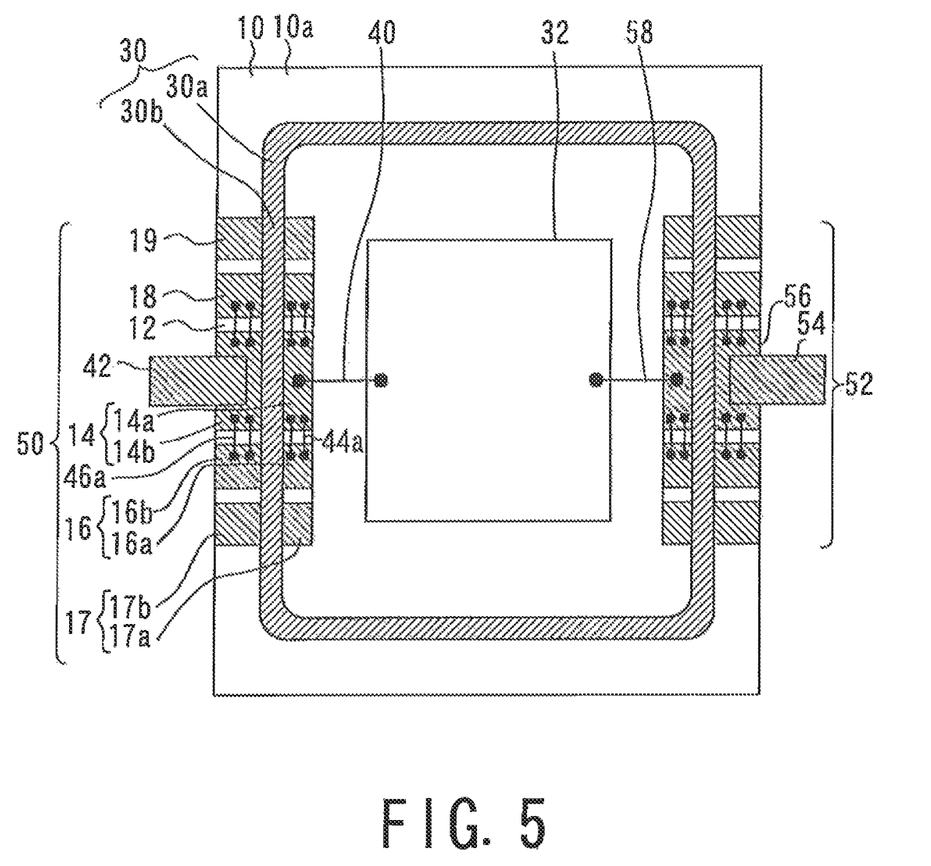
FIG. 5 shows only the island patterns immediately adjacent to the signal line are connected to the signal line by wires.
Figure 6:
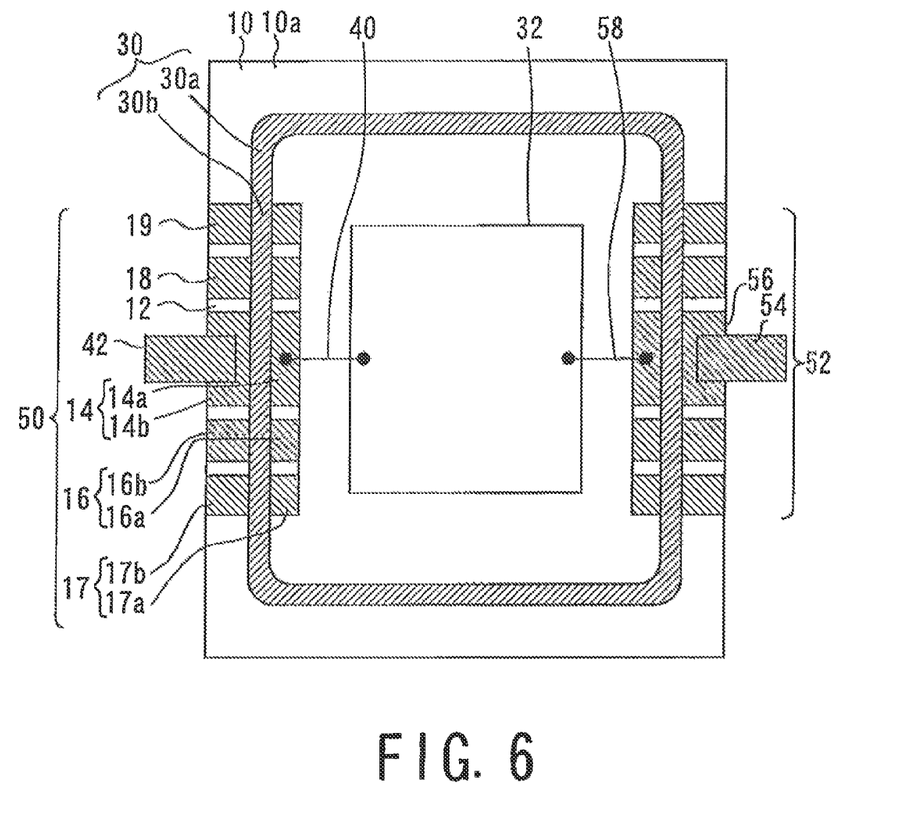
FIG. 6 shows the signal lines are not connected to any of the island patterns.

FIG. 5 is a plan view of the high frequency device of the first embodiment wherein: in the feed-though portion 50 only the island patterns immediately adjacent to the signal line 14 are connected to the signal line 14 by wires; and in the feed-through portion 52 only the island patterns immediately adjacent to the signal line 56 are connected to the signal line 56 by wires. In this case, the island patterns 17 and 19 in each of the feed-through portions 50 and 52 do not contribute to signal transmission. That is, the effective signal line widths of the feed-through portions 50 and 52 are narrower than those in the configuration shown in FIG. 1. FIG. 6 is a plan view of the high frequency device of the first embodiment wherein the signal lines 14 and 56 are not connected to any of the island patterns. In this configuration, the effective signal line widths of the feed-through portions 50 and 52 are narrower than those in the configurations shown in FIGS. 1 and 5.

Figure 7:
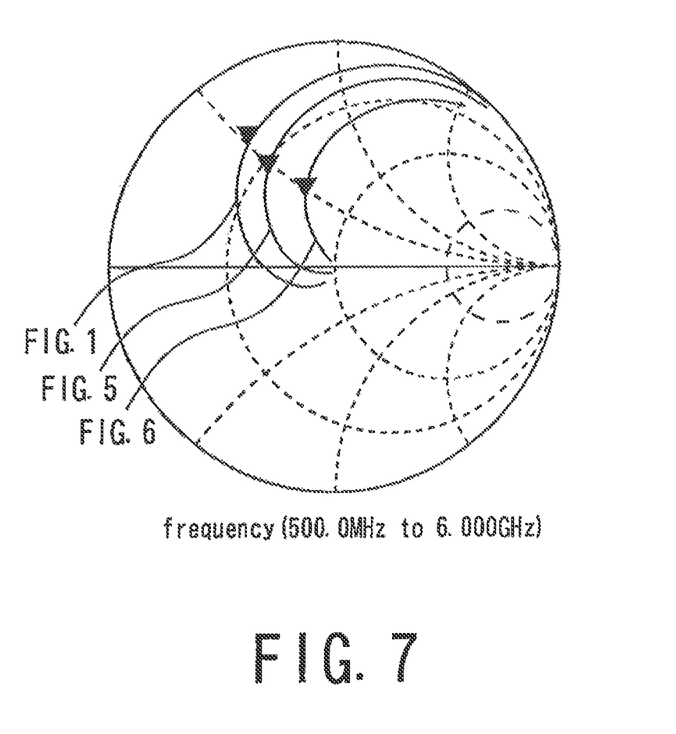
FIG. 7 shows the changes in the impedance of a feed-through portion.

FIG. 7 is a graph showing the changes in the impedance of a feed-through portion that occur when island patterns are selectively connected to and disconnected from the signal line in the feed-through portion. The data used to generate the graph shown in FIG. 7 was obtained by applying electromagnetic field analysis (simulation) to the feed-through portions of the high frequency devices shown in FIGS. 1, 5, and 6. In FIG. 7, each inverted triangle marker indicates the impedance of a feed-through portion of one of the high frequency devices at an operating frequency of 2.6 GHz. As can be seen from FIG. 7, the impedance of each feed-through portion can be varied by changing the number of island patterns connected to the signal line in the feed-through portion.

Thus, in the high frequency device of the first embodiment, the impedance of each feed-through portion can be adjusted by selectively connecting and disconnecting island patterns to and from the signal line in the feed-through portion. Therefore, even if the semiconductor chip mounted in the high frequency device is changed after the dimensions of the high frequency device are determined, it is possible to achieve optimum impedance matching to the changed semiconductor chip without changing the dimensions of the high frequency device. That is, it is possible to easily achieve impedance matching to the semiconductor chip used.

This ease in impedance matching results in greater design freedom. Further, the impedance of the feed-through portions of the high frequency device can be adjusted to achieve impedance matching to semiconductor chips and external components of various impedances, meaning that the high frequency device is highly versatile.

Although the first embodiment has been described in connection with a high frequency device in which two island patterns are formed on each of the left and right sides of each signal pattern, it is to be understood that the present embodiment is not limited to this particular number of island patterns. For example, in the simplest configuration of the present embodiment, only one island pattern may be provided adjacent each signal line. However, a plurality of island patterns are preferably disposed adjacent the signal line in each feed-through portion so that the impedance of the feed-through portion can be adjusted in multiple steps. Thus, the number of island patterns to be formed may be determined based on market requirements.

There is no restriction on the number of wires that can be used to connect between each signal line and island patterns and between island patterns. The connection of these wires may be accomplished by, but is not limited to, wire bonding using a capillary. Further, in the high frequency device of the present embodiment, each signal line may be connected to any of the plurality of island patterns. Therefore, the present invention is not limited to the number of wires or the connection method shown in FIG. 1.

The semiconductor chip 32 may not be an FET chip, but may be configured as a matching circuit substrate. It should be noted that the above alterations to the present embodiment may also be made to the subsequently described embodiments.

Second Embodiment

Figure 8:
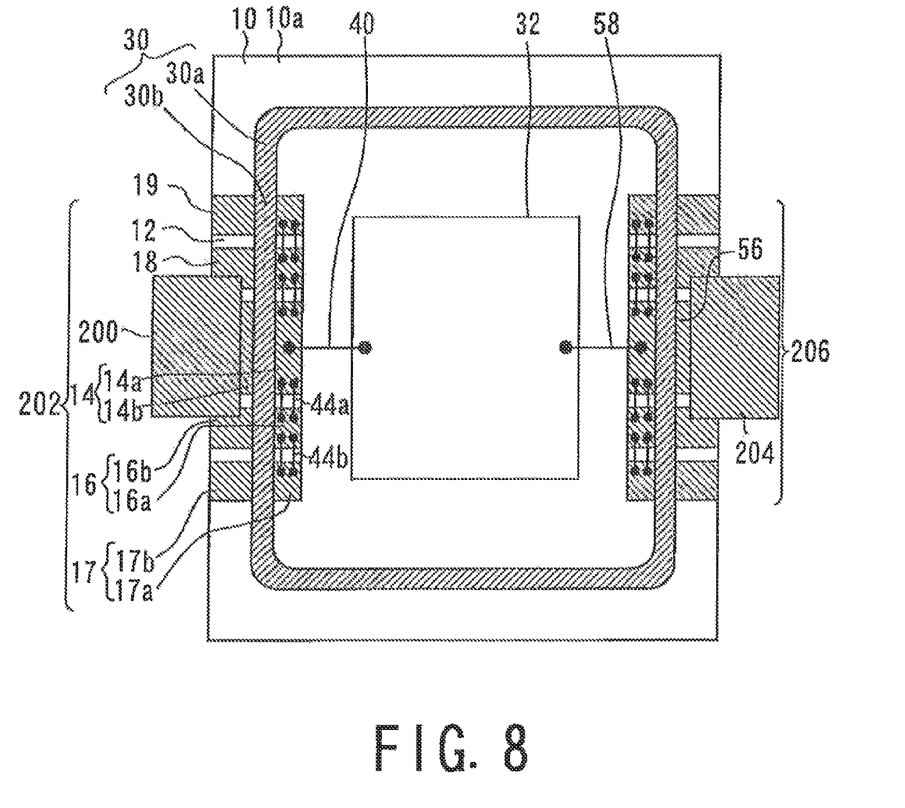
FIG. 8 is a plan view of the high frequency device of the second embodiment.

A second embodiment of the present invention provides a high frequency device which has many features common to the high frequency device of the first embodiment. Therefore, the following description of the second embodiment will be primarily limited to the differences from the first embodiment. FIG. 8 is a plan view of the high frequency device of the second embodiment.

The high frequency device shown in FIG. 8 includes a feed-through portion 202 and a feed-through portion 206 disposed on opposite sides thereof. The feed-through portion 202 includes a lead frame 200 which is connected to the outside signal line 14*b* and the portions of the island patterns 16 and 18 outside the metal frame 30 (i.e., the outside island patterns of the island patterns 16 and 18). A lead frame 204 similar to the lead frame 200 is formed in the feed-through portion 206.

In the case of the high frequency device shown in FIG. 1, the wires disposed outside the metal frame 30 are exposed to ambient atmosphere, which may result in detachment of the wires. Therefore, other more suitable means for adjusting the effective signal line width of each feed-through portion should preferably be disposed outside the metal frame 30. In the high frequency device of the second embodiment, the widths of the lead frames 200 and 204 can be changed to adjust the effective signal line widths of the feed-through portions 202 and 206 (or the effective widths of the signal lines 14 and 56), respectively. In this way the effective signal line width of each feed-through portion can be adjusted without exposing wires to ambient atmosphere.

It should be noted that, e.g., the lead frame 200 shown in FIG. 8 may be replaced by a lead frame having a larger width so as to connect the signal line 14 to the outside island patterns of all the island patterns 16, 17, 18, and 19.

Third Embodiment

A third embodiment of the present invention provides a high frequency device which has many features common to the high frequency device of the first embodiment. Therefore, the following description of the third embodiment will be primarily limited to the differences from the first embodiment. In the high frequency device of the third embodiment, the impedance of each feed-through portion can be adjusted by a method different from that used to adjust the impedance of each feed-through portion in the high frequency device of the first embodiment using island patterns.

Figure 9:
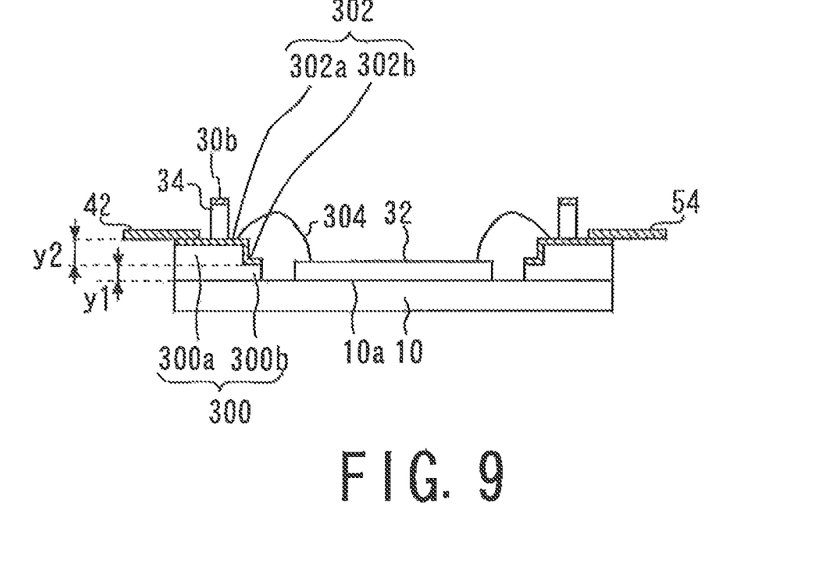
FIG. 9 is a cross-sectional view of the high frequency device of the third embodiment.

FIG. 9 is a cross-sectional view of the high frequency device of the third embodiment. A dielectric 300 includes a first dielectric 300a and a second dielectric 300b having different thicknesses. The first dielectric 300a is formed on the main surface 10a along one side of the base plate 10. The second dielectric 300b is in contact with the side of the first dielectric 300a which faces toward the central portion of the main surface 10a. The second dielectric 300b has a smaller thickness than the first dielectric 300a. It should be noted, however, that the present embodiment only requires that the first dielectric 300a and the second dielectric 300b have different thicknesses.

A signal line 302 is formed to continuously extend on the first dielectric 300a and the second dielectric 300b. Specifically, the signal line 302 includes a portion 302a formed on the first dielectric 300a and a portion 302b formed on the second dielectric 300b; these portions 302a and 302b are formed integrally with each other.

The bridge portion 30b of the metal frame 30 is formed on the portion 302a of the signal line 302, with the additional dielectric 34 therebetween. The lead frame 42 is connected to the portion of the signal line 302 outside the metal frame 30. The semiconductor chip 32 is connected by a wire 304 to the portion 302a of the signal line 302 which is formed on the first dielectric 300a. It should be noted that the components described above constitute the feed-through portion on the left side of the base plate 10, and this feed-through portion and the feed-through portion on the right side of the base plate 10 have a similar configuration.

The high frequency device of the third embodiment is characterized in that the dielectric 300 has a stepped configuration. When the wire 304 is attached to the signal line portion 302a on the first dielectric 300a, as shown in FIG. 9, the portion of the dielectric 300 which contributes to, or affects, the impedance of the feed-through portion has a thickness of y1+y2 (see FIG. 9).

Figure 10:
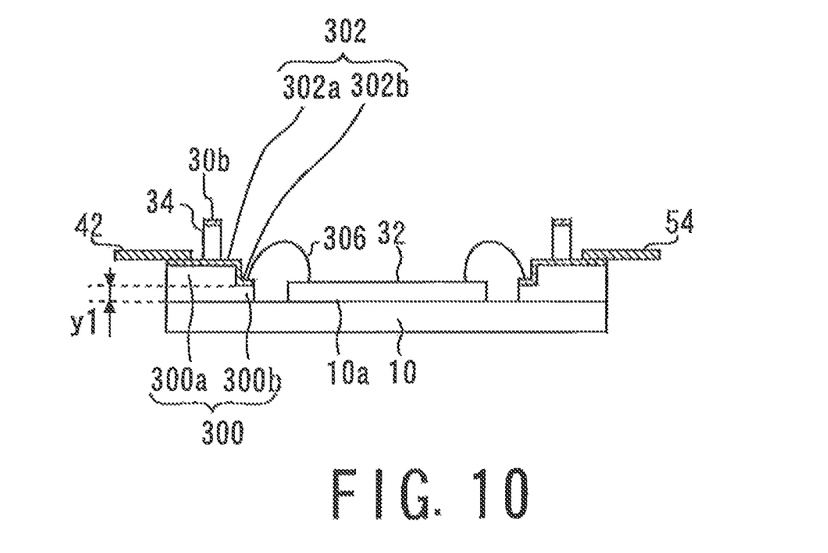
FIG. 10 is a cross-sectional view showing a configuration similar to that of FIG. 9, except that the semiconductor chip is connected by a wire to the portion of the signal line on the second dielectric.

FIG. 10 is a cross-sectional view showing a configuration similar to that of FIG. 9, except that the semiconductor chip 32 is connected by a wire to the portion 302b of the signal line 302 on the second dielectric 300b, instead of to the portion 302a of the signal line 302 on the first dielectric 300a. Specifically, the semiconductor chip 32 is connected to the portion 302b of the signal line 302 by a wire 306. In this case, the portion of the dielectric 300 which contributes to, or affects, the impedance of the feed-through portion has a thickness y1 (see FIG. 10).

Thus, the high frequency device of the third embodiment is configured such that the semiconductor chip 32 can be selectively connected either to the portion 302a of the signal line 302 (by the wire 304 as shown in FIG. 9) or to the portion 302b of the signal line 302 (by the wire 306 as shown in FIG. 10). This means that one or the other of two portions of the dielectric 300 which have different thicknesses can be selectively caused to contribute to, or affect, the impedance of the feed-through portion. That is, the impedance of each feed-through portion can be adjusted by changing the point on the signal line at which a wire is bonded thereto. Furthermore, since the wire 304 is secured to the portion 302a of the signal line 302 and the wire 306 is secured to the portion 302b of the signal line 302, the wires 304 and 306 have different lengths, which affect the impedance of the feed-through portion differently.

Fourth Embodiment

Figure 11:
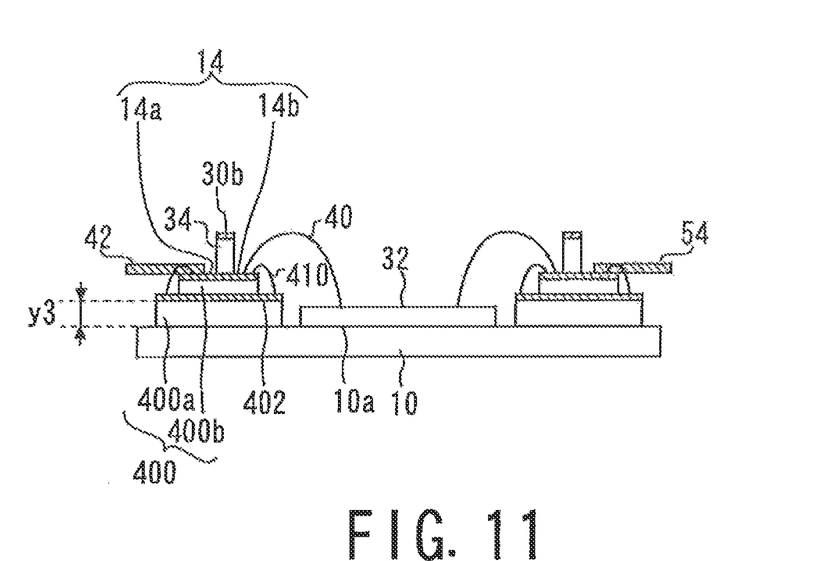
FIG. 11 is a cross-sectional view of the high frequency device of the fourth embodiment.

A fourth embodiment of the present invention provides a high frequency device which has many features common to the high frequency device of the first embodiment. Therefore, the following description of the fourth embodiment will be primarily limited to the differences from the first embodiment. FIG. 11 is a cross-sectional view of the high frequency device of the fourth embodiment. Whereas in the high frequency device of the third embodiment the impedance of each feed-through portion can be adjusted by using two portions of a dielectric which have different thicknesses, in the high frequency device of the fourth embodiment the impedance of each feed-through portion can be adjusted by using two dielectrics having different thicknesses.

A lower layer dielectric 400a is formed on the main surface 10a. The lower layer dielectric 400a is formed along one side of the base plate 10. An intermediate metal 402 is formed on the lower layer dielectric 400a. An upper layer dielectric 400b is formed on a portion of the surface of the intermediate metal 402; the rest of the surface of the intermediate metal 402 is exposed to ambient atmosphere. The upper layer dielectric 400b has a smaller thickness than the lower layer dielectric 400a. It should be noted, however, that the present embodiment only requires that the upper layer dielectric 400b have a different thickness than the lower layer dielectric 400a.

The signal line 14 is formed on the upper layer dielectric 400b. The lower layer dielectric 400a and the upper layer dielectric 400b together form a dielectric 400. The signal line 14 and the intermediate metal 402 are connected together by two additional wires 410. One of the additional wires 410 is disposed outside the metal frame 30, and the other additional wire 410 is disposed inside the metal frame 30.

The high frequency device of the fourth embodiment is characterized in that the intermediate metal 402 is formed between the upper layer dielectric 400b and the lower layer dielectric 400a. Since the signal line 14 and the intermediate metal 402 are connected together by the additional wires 410, as shown in FIG. 11, they are at equal potentials. Therefore, only the lower layer dielectric 400a, which has a thickness y3, contributes to, or affects, the impedance of the feed-through portion on the left side of the base plate 10.

Figure 12:
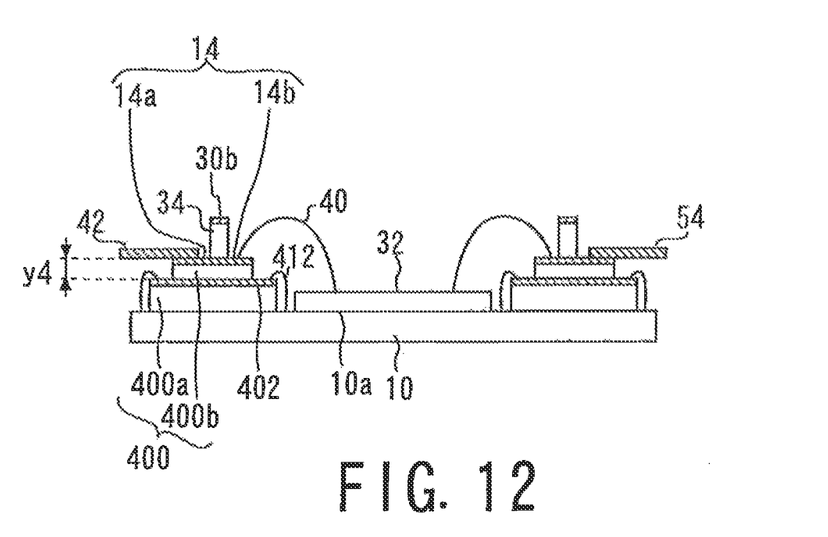
FIG. 12 is a cross-sectional view showing a configuration similar to that of FIG. 11, except that the intermediate metal is connected by additional wires to the base plate.

On the other hand, if the intermediate metal 402 is connected by additional wires to the base plate 10 instead of to the signal line 14, then the intermediate metal 402 is at the same potential as the base plate 10, i.e., at ground potential. FIG. 12 is a cross-sectional view showing a configuration similar to that of FIG. 11, except that the intermediate metal 402 is connected by additional wires 412 to the base plate 10 instead of to the signal line 14. In this case, only the upper layer dielectric 400b, which has a thickness y4, contributes to, or affects, the impedance of the feed-through portion.

Thus, the high frequency device of the fourth embodiment is configured such that, e.g., in the feed-through portion on the left side of the base plate 10, the intermediate metal 402 can be selectively connected either to the signal line 14 (by the additional wires 410 as shown in FIG. 11) or to the base plate 10 (by the additional wires 412 as shown in FIG. 12). By doing so, either the lower layer dielectric 400a or the upper layer dielectric 400b, each having a different thickness, can be selectively caused to contribute to, or affect, the impedance of the feed-through portion. In this way it is possible to adjust the impedance of the feed-through portion.

Fifth Embodiment

Figure 13:
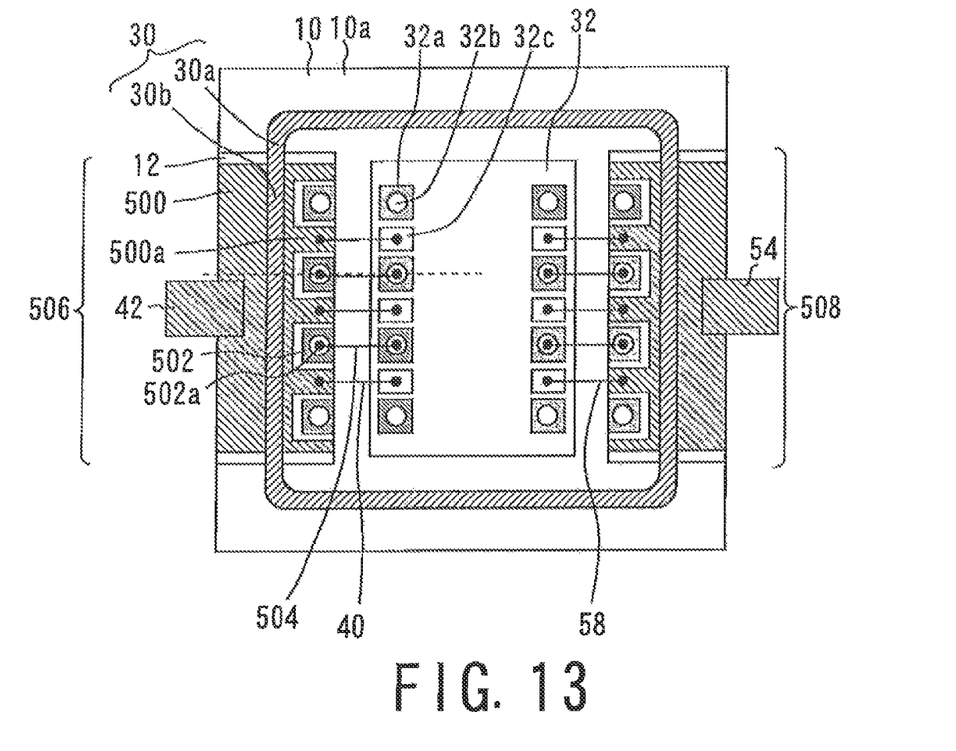
FIG. 13 is a plan view of the high frequency device of the fifth embodiment.

A fifth embodiment of the present invention provides a high frequency device which has many features common to the high frequency device of the first embodiment. Therefore, the following description of the fifth embodiment will be primarily limited to the differences from the first embodiment. FIG. 13 is a plan view of the high frequency device of the fifth embodiment.

A signal line 500 is formed on the dielectric 12 and extends from one side of the base plate 10 toward the central portion of the main surface 10a. The side, or end, of the signal line 500 facing toward the central portion of the main surface 10a has thereon a comb-toothed portion 500a formed in a comb shape. An additional metal portion 502 is formed between, and without contact with, each two adjacent teeth of the comb-toothed portion 500a. Each of these additional metal portions 502 has formed therein a first through-hole 502a which penetrates through the additional metal portion 502 and the underlying dielectric 12. The walls of the first through-holes 502a in the dielectric 12 are covered with plating. The additional metal portions 502 are electrically connected through this plating to the surface of the base plate 10 exposed by the first through holes 502a.

Ground pads 32a are formed on the semiconductor chip 32. Each ground pad 32a has formed therein a second through-hole 32b which penetrates through the ground pad 32a and the underlying the semiconductor chip 32. The walls of the second through-holes 32b in the semiconductor chip 32 are covered with plating. The ground pads 32a are electrically connected to the base plate 10 through this plating.

The semiconductor chip 32 is provided with signal pads 32c for transmitting a high frequency signal. Each signal pad 32c of the semiconductor chip 32 is connected to a corresponding tooth of the comb-toothed portion 500a of the signal line 500 by a first wire 40. Each additional metal portion 502 is connected to a corresponding one of the ground pads 32a by a ground wire 504. These ground wires 504 may be secured by means of, e.g., solder. It should be noted that the feed-through portion 506 on the left side of the base plate 10 includes the signal line 500, the comb-toothed portion 500a, and the additional metal portions 502, etc., and this feed-through portion 506 and the feed-through portion 508 on the right side of the base plate 10 have a similar configuration.

Figure 14:
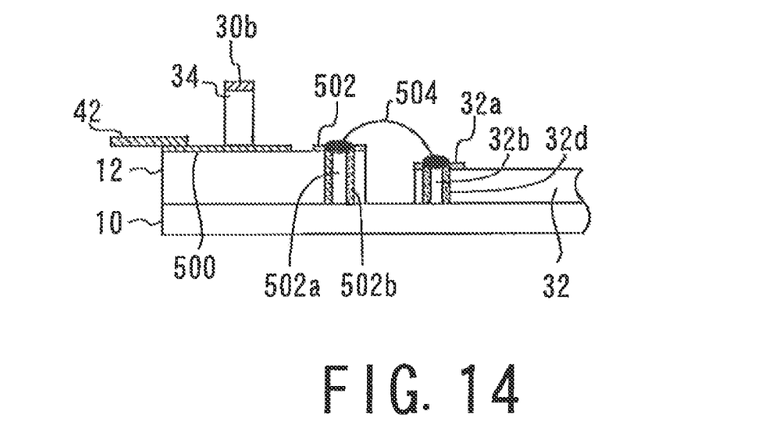
FIG. 14 is a cross-sectional view taken along the dashed line of FIG. 13.

FIG. 14 is a cross-sectional view taken along the dashed line of FIG. 13. The bridge portion 30b is formed on the additional dielectric 34 disposed on a portion of the signal line 500 which is located closer to said one side of the base plate 10 than is the comb-toothed portion 500a. The additional metal portions 502 are connected to the base plate 10 by plating 502b. The ground pads 32a are connected to the base plate 10 by plating 32d.

In the high frequency device of the fifth embodiment, when the additional metal portions 502 are not connected to the ground pads 32a, the signal line 500 and the first wires 40 are electrically connected to the base plate 10 (i.e., to ground) only by the plating 502b. On the other hand, when the additional metal portions 502 are connected to the ground pads 32a by, e.g., the ground wires 504, the signal line 500 and the first wires 40 are electrically connected to the base plate 10 by both the plating 502b and the plating 32d.

This means that the impedance of the feed-through portion 506 can be varied by selectively connecting the additional metal portions 502 to the ground pads 32a (using the ground wires 504) and disconnecting the additional metal portions 502 from the ground pads 32a. Since the feed-through portion 506 of the high frequency device of the fifth embodiment has four additional metal portions, namely the four additional metal portions 502, formed therein, the impedance of the feed-through portion 506 can be set to five different values by changing the number of additional metal portions 502 connected to ground pads 32a by ground wires 504.

Figure 15:
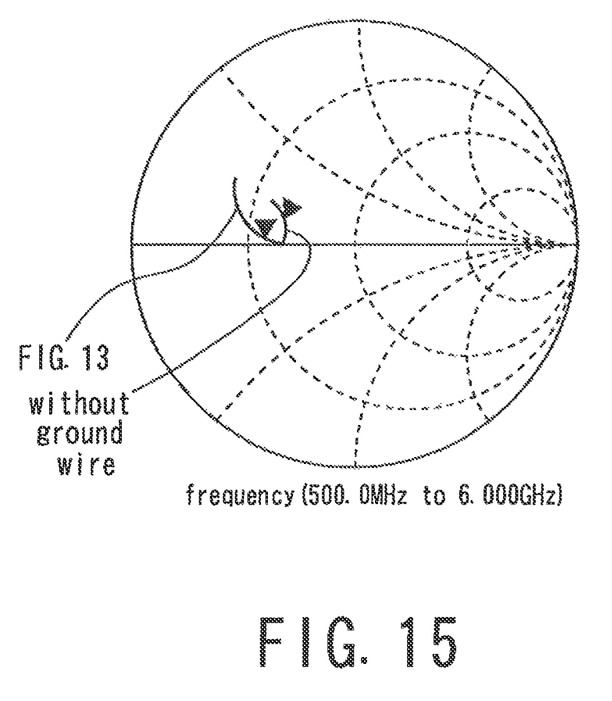
FIG. 15 is a graph showing the impedances of a feed-through portion.

FIG. 15 is a graph showing the impedances of a feed-through portion with and without ground wires. The data used to generate the graph shown in FIG. 15 was obtained by applying electromagnetic field analysis (simulation) to the high frequency device of FIG. 13, and to the same high frequency device with the ground wires 504 removed. In FIG. 15, the inverted triangle markers indicate the impedances of the feed-through portion in these two cases at an operating frequency of 2.6 GHz. As can be seen from FIG. 15, the impedance of, e.g., the feed-through portion 506 can be varied by selectively connecting the additional metal portions 502 to the ground pads 32a (using the ground wires 504) and disconnecting the additional metal portions 502 from the ground pads 32a. It should be noted that the feed-through portion 506 of the present embodiment includes the first wire 40.

The first through-hole 502a and the second through-hole 32b are not required if the additional metal portions 502 and the ground pads 32a can be set to ground potential by other means. For example, vias reaching the base plate 10 may be formed in the dielectric 12 and the semiconductor chip 32 so that the additional metal portions and the ground pads are at ground potential. It should be noted that features of the high frequency devices of embodiments described above may be combined where appropriate.

Thus, the feed-through portions of the high frequency devices of the present invention are provided with an impedance adjusting function so that impedance matching can be easily achieved in the high frequency devices.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-258889, filed on Nov. 27, 2012, including specification, claims, drawings, and summary, on which the Convention priority of the present application is based, is incorporated herein by reference in its entirety.

What is claimed is:

1. A high frequency device comprising:
a base plate having a main surface and opposed first and second sides;
a first dielectric layer on said main surface, along said first side of said base plate;

a signal line on said first dielectric layer and extending from said first side toward a central portion of said main surface;
an island pattern of a metal on said first dielectric layer, adjacent said signal line, and extending from said first side toward said central portion without contacting said signal line;
a second dielectric layer on a portion of said signal line and a portion of said island pattern;
a metal frame having a contact portion in contact with said main surface and having a bridge portion on said second dielectric layer, said contact portion and said bridge portion together enclosing said central portion of said main surface, wherein said signal line includes an outside signal line and an inside signal line respectively outside and inside said metal frame;
a lead frame connected to said outside signal line;
a semiconductor chip secured to said central portion of said main surface;
a first wire connecting said semiconductor chip to said inside signal line; and
a second wire connecting said signal line to said island pattern.

2. The high frequency device according to claim 1 further comprising a plurality of island patterns, wherein said second wire connects said signal line to at least one island pattern of said plurality of island patterns.

3. The high frequency device according to claim 1, wherein
said second wire connects said inside signal line to an inside island pattern of said island pattern, and
said inside island pattern is a portion of said island pattern enclosed within said metal frame.

4. The high frequency device according to claim 1, wherein
said second wire connects said outside signal line to an outside island pattern of said island pattern,
said outside island pattern is a portion of said island pattern located outside said metal frame.

5. The high frequency device according to claim 1, wherein
said lead frame is connected to said outside signal line and an outside island pattern of said island pattern, and
said outside island pattern is a portion of said island pattern located outside said metal frame.

6. The high frequency device according to claim 1, further comprising a third dielectric layer in contact with a portion of said first dielectric layer which faces toward the central portion of said main surface, said third dielectric layer having a different thickness from said first dielectric layer, wherein
said signal line continuously extends on said first and third dielectric layers, and
said first wire connects said semiconductor chip to a portion of said inside signal line on said first dielectric layer or on said third dielectric layer.

* * * * *